(12) United States Patent
Qian

(10) Patent No.: US 8,442,712 B2
(45) Date of Patent: May 14, 2013

(54) SYSTEM AND METHOD TO THERMALLY PROTECT A TRANSISTOR IN AN ELECTRIC DRIVE VEHICLE

(75) Inventor: Lewei Qian, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 76 days.

(21) Appl. No.: 13/222,785

(22) Filed: Aug. 31, 2011

(65) Prior Publication Data

US 2013/0054059 A1    Feb. 28, 2013

(51) Int. Cl.
 *B60W 20/00* (2006.01)
 *G01K 7/00* (2006.01)
 *G01L 19/0092* (2006.01)

(52) U.S. Cl.
 USPC ............ 701/22; 702/136; 702/138; 374/178

(58) Field of Classification Search .......... 702/136, 702/138; 374/178; 73/384; 701/22
 See application file for complete search history.

(56) References Cited

U.S. PATENT DOCUMENTS

| | | | | |
|---|---|---|---|---|
| 4,344,106 A | * | 8/1982 | West et al. ............... | 361/717 |
| 4,378,772 A | * | 4/1983 | Meyer ..................... | 123/438 |
| 4,755,741 A | * | 7/1988 | Nelson .................... | 323/289 |
| 5,063,307 A | * | 11/1991 | Zommer ................... | 327/512 |
| 5,349,336 A | * | 9/1994 | Nishiura et al. .......... | 340/653 |
| 5,446,362 A | | 8/1995 | Vanek et al. | |
| 5,712,802 A | | 1/1998 | Kumar et al. | |
| 5,764,541 A | | 6/1998 | Hermann et al. | |
| 6,412,977 B1 | * | 7/2002 | Black et al. .............. | 374/178 |
| 6,671,152 B1 | * | 12/2003 | Hersel et al. ............. | 361/93.8 |
| 7,148,453 B2 | * | 12/2006 | Bohlender et al. ........ | 219/491 |
| 7,279,954 B2 | * | 10/2007 | Throngnumchai et al. ... | 327/512 |
| 7,368,784 B2 | * | 5/2008 | Botti et al. ............... | 257/341 |
| 7,734,440 B2 | * | 6/2010 | Hattis ...................... | 702/99 |
| 7,734,444 B2 | | 6/2010 | Arroyo et al. | |
| 8,143,991 B2 | * | 3/2012 | Yang ........................ | 337/407 |
| 2009/0217754 A1 | | 9/2009 | Binda et al. | |

FOREIGN PATENT DOCUMENTS

EP    1691484 A1 *  8/2006

* cited by examiner

*Primary Examiner* — Mary Cheung
*Assistant Examiner* — Anne Mazzara
(74) *Attorney, Agent, or Firm* — Leydig, Voit & Mayer

(57) ABSTRACT

An electronic system for an electric drive mobile machine includes at least one transistor that emits heat, a pressure detector that generates a pressure signal, a temperature detector providing a first temperature signal indicative of the detected first temperature and a second temperature of or substantially adjacent to the transistor, and a controller configured to determine a temperature protection set point based upon the first temperature signal and the pressure signal and execute a control strategy for thermally protecting the transistor when the first temperature signal indicates that the first temperature reaches the temperature protection set point.

20 Claims, 6 Drawing Sheets

SYSTEM AND METHOD TO THERMALLY PROTECT A TRANSISTOR IN AN ELECTRIC DRIVE VEHICLE

TECHNICAL FIELD

This patent disclosure relates generally to power electronics including transistors such as insulated gate bipolar transistors ("IGBTs"), and, more particularly to a system and method to thermally protect transistors in electric drive vehicles.

BACKGROUND

Electric drive vehicles utilize power electronics such as insulated gate bipolar transistors ("IGBTs") to provide high efficiency and rapid power switching. IGBTs, IGBT modules and other transistors will typically generate heat, which may hamper the reliability of the devices if left unchecked. As a result, over-temperature protection is typically utilized in applications in order to ensure optimal operational reliability.

Resistance temperature detectors ("RTDs") are commonly utilized in over-temperature protection systems. Inasmuch as it may be difficult, at best, to position a temperature detector into a IGBT module in the junction or die area, a temperature detector is typically positioned on the heatsink of the IGBT module, close to the base plate of the IGBT. An RTD so positioned provides a reading of the temperature at the heatsink (Tfin). As a precautionary matter, the estimated temperature at the junction itself (Tj) is calculated based upon adding to the measured heatsink temperature (Tfin) a maximum temperature differential (delta Tjf) between junction (Tj) and heatsink (Tfin).

To protect IGBTs, it is common to establish a RTD set or threshold value as a trigger. When the RTD reading reaches this value, the junction temperature (Tj) likewise will be nearing its maximum allowed value; other protections are then initiated, typically in the form of an algorithm that establishes further action. In order to provide adequate opportunity for the engagement of thermal protection of the IGBT, the RTD set or threshold value is typically set at a temperature less than the heatsink temperature (Tfin) that would indicate that the junction temperature (Tj) has reached or is nearing a temperature that would potentially damage the IGBTs. This differential between the temperature at the heatsink (Tfin) and the set or threshold valve to trigger thermal protection is generally a set value that is established based upon experience with the elements involved and the thermal protection to be initiated.

While this procedure has been generally effective, it has met with some difficulty in high altitudes, where the normal thermal protection algorithm does not ensure thermal protection of expensive IGBT modules. In an air cooled system, the air density may change dramatically over altitude changes from, for example, sea level to 5000 meters. As a result, cooling is not as effective as in the high altitude. With a constant set or threshold value, if the electric machine is placed in a higher altitude application, the thermal protection algorithm may either be tripped frequently, or fail to be tripped, even when the junction temperature reaches maximum value allowed.

U.S. Pat. No. 5,446,362 to Vanek describes a thermal protection system for an AC motor that is cooled by a blower. The patent describes the implementation of air density adjustments due to altitude and ambient temperature variations to calculate blower speed requirements. To date, however, thermal protection systems for IGBT modules and transistors are not able to adjust for such variations in altitude.

SUMMARY

The disclosure describes, in one aspect, an electronic system for an electric drive mobile machine. The system includes at least one transistor that emits heat, at least one pressure detector disposed to detect pressure and generate a pressure signal, at least one temperature detector disposed to detect a first temperature and provide a first temperature signal indicative of the detected first temperature, and a controller. The first temperature signal is also being indicative of a second temperature of or substantially adjacent to the transistor. The controller is configured to determine a temperature protection set point based upon the first temperature signal and the pressure signal. The controller is further configured to execute a control strategy for thermally protecting the at least one transistor when the first temperature signal indicates that the first temperature has reached the temperature protection set point.

The disclosure describes, in another aspect, a method of controlling the application of thermal protections for a heat emitting transistor in an electric drive mobile machine. The method includes the steps of providing the transistor in the electric drive mobile machine, detecting a pressure substantially indicative of an air pressure surrounding the machine, and generating a pressure signal based upon the detected pressure, detecting a first temperature, and providing a first temperature signal indicative of the detected first temperature and of a second temperature of or substantially adjacent to the transistor, determining a temperature protection set point based upon the first temperature signal and the pressure signal, and generating a control strategy for thermally protecting the at least one heat emitting transistor when the first temperature signal indicates that the first temperature has reached the temperature protection set point.

The disclosure describes, in yet another aspect, a controller for controlling thermal protection of at least one heat emitting transistor in an electric drive mobile machine. The controller includes a computer-readable memory having thereon computer-executable instructions including instructions for receiving a pressure signal based upon a detected pressure, instructions for receiving a first temperature signal indicative of a detected first temperature and of a second temperature of or substantially adjacent to the heat emitting transistor, instructions for determining a temperature protection set point based upon the first temperature signal and the pressure signal, and instructions for executing a control strategy for thermally protecting the at least one heat emitting transistor when the first temperature signal indicates that the first temperature has reached the temperature protection set point.

BRIEF DESCRIPTION OF THE DRAWING(S)

DETAILED DESCRIPTION

Figure 1:
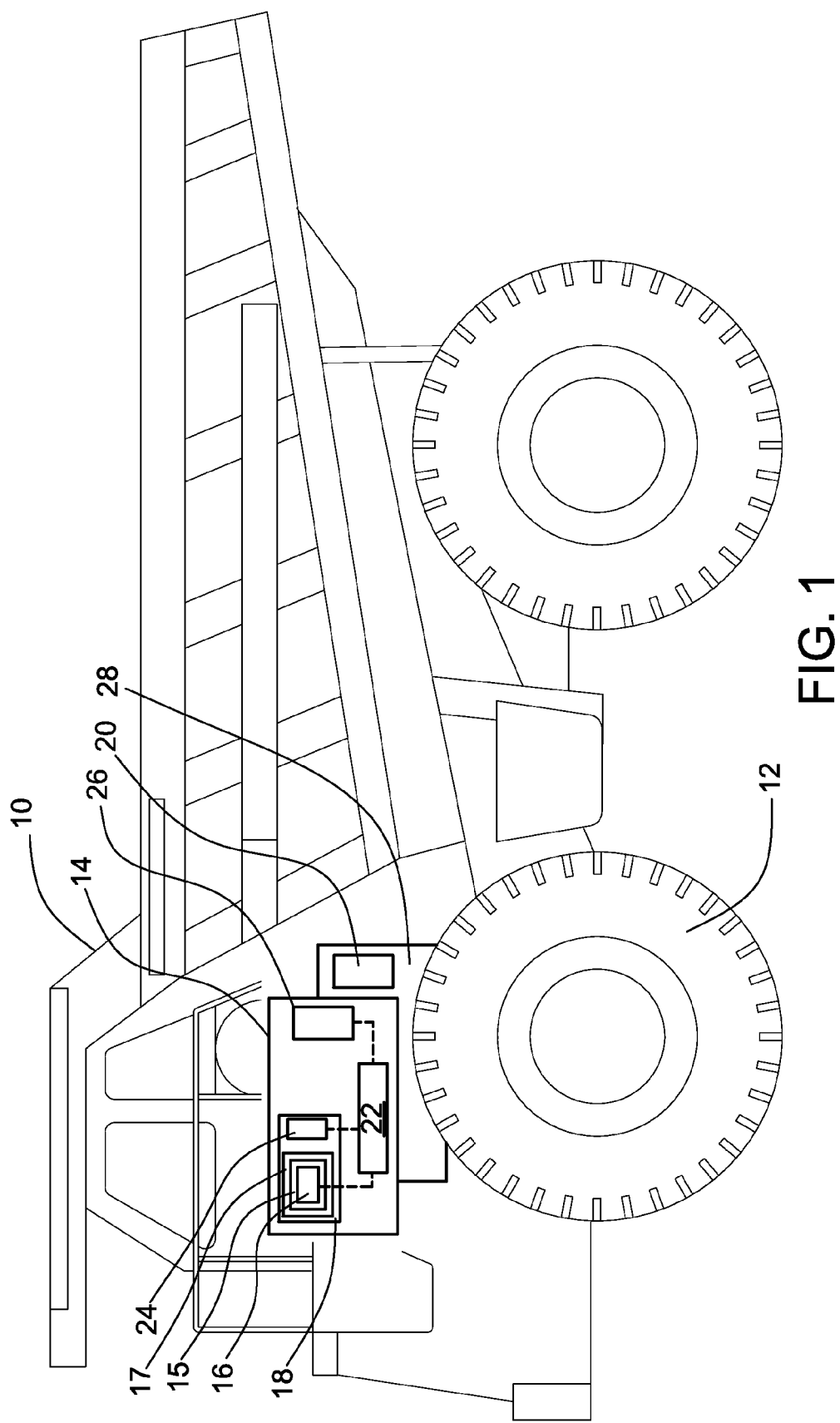
FIG. 1 is a schematic view of a machine according to the disclosure.

This disclosure relates to electric drive machines, and, more particularly to electric drive machines with an air cooled inverter system that uses one or more transistor based products, such as insulated gate bipolar transistors ("IGBTs"). Referring to FIG. 1, there is shown schematically, an electric drive machine 10, which includes a plurality of motivators 12, such as, for example, tracks or the wheels shown, as well as an electronic system 14. The electronic system 14 may include an IGBT module 15 having one or more IGBTs 16 having a base plate 17 disposed on a heatsink 18. It will be appreciated that, although an IGBT 16 is discussed herein, the disclosure may equally apply to one or more other transistor based products, such as thyristers, diodes, and metal-oxide-semiconductor field-effect transistor ("MOSFETS")

In order to ensure optimal operational reliability, the machine 10 may take one or more measures to minimize opportunities for the IGBTs 16 to overheat, which may potentially result in failure. The machine 10 may undertake selective measures to provide cooling to the IGBTs and other components of the electronic system 14 as desired. Such cooling measures may include, for example, engagement of a cooling system 20 to provide cooling to the IGBTs 16. Alternatively, or additionally, a process may be utilized that that provides, for example, a series of steps, including notifications or alarms, before ultimately shutting down operation of the machine 10, as will be discussed below.

The electronic system 14 further includes a controller 22, and one or more temperature detectors 24. The illustrated controller 22 may be configured to receive various types of signals, for example, signals from the temperature detector(s) 24, perform certain operations, for example, initiation of an alarm system or operation of the cooling system 20, and provide signals to other machine components.

The illustrated temperature detector 24 is positioned on the heatsink 18 of the IGBT module 15, close to the base plate 17 of the IGBT 16. As a result, the illustrated temperature detector 24 is disposed to measure the temperature (Tfin) of the heatsink 18 and to send a temperature signal to the controller 22 indicative of the measured temperature (Tfin) of the heatsink 18. In this way, the temperature signal is indicative not only of the measured first temperature, or temperature (Tfin), but also of a second temperature, that is, the temperature (Tj) at the junction of the base plate 17 of the IGBT 16 and the heatsink 18. The temperature detectors 24 may be of any appropriate design suitable for operation at high altitudes. For example, the temperature detectors 24 may be resistance temperature detectors ("RTDs").

According to a feature of the disclosure, the operation of thermal protection procedures is based not only upon the temperature (Tfin) detected by the temperature detector 24, but also upon the altitude at which the machine 10 is operating. That is, temperature protection set point is determined based upon the altitude at which the machine 10 is operating. When measured temperature (Tfin), or first temperature, reaches this temperature protection set point, the controller 22 executes instructions for thermal protection of the IGBTs 16.

In order to determine the altitude at which the machine 10 is operating, at least one pressure detector 26 is provided. The pressure detector 26, which may be of any appropriate design, may be disposed such that it measures the pressure of the atmosphere at which the machine 10 is located. In operation, the pressure detector 26 sends a signal corresponding to the measured pressure to the controller 22.

Based upon the measured pressure, that is, based upon the altitude corresponding to the measured pressure, the controller 22 utilizes a temperature protection set point that is appropriate under the physical conditions at which the machine 10 is operating. In other words, the controller 22 utilizes one or more curves based upon the altitude to determine the temperature protection set point at which cooling procedures will be initiated. While the charts illustrating exemplary curves discussed herein identify altitude, it will be appreciated that the curves are alternately or likewise based upon pressure inasmuch as pressure and altitude under these circumstances are indicative of one another. When the measured temperature (Tfin) reaches the identified temperature protection set point based upon an applicable curve, the controller 22 provides a signal initiating steps to thermally protect the IGBTs 16.

Figure 2:
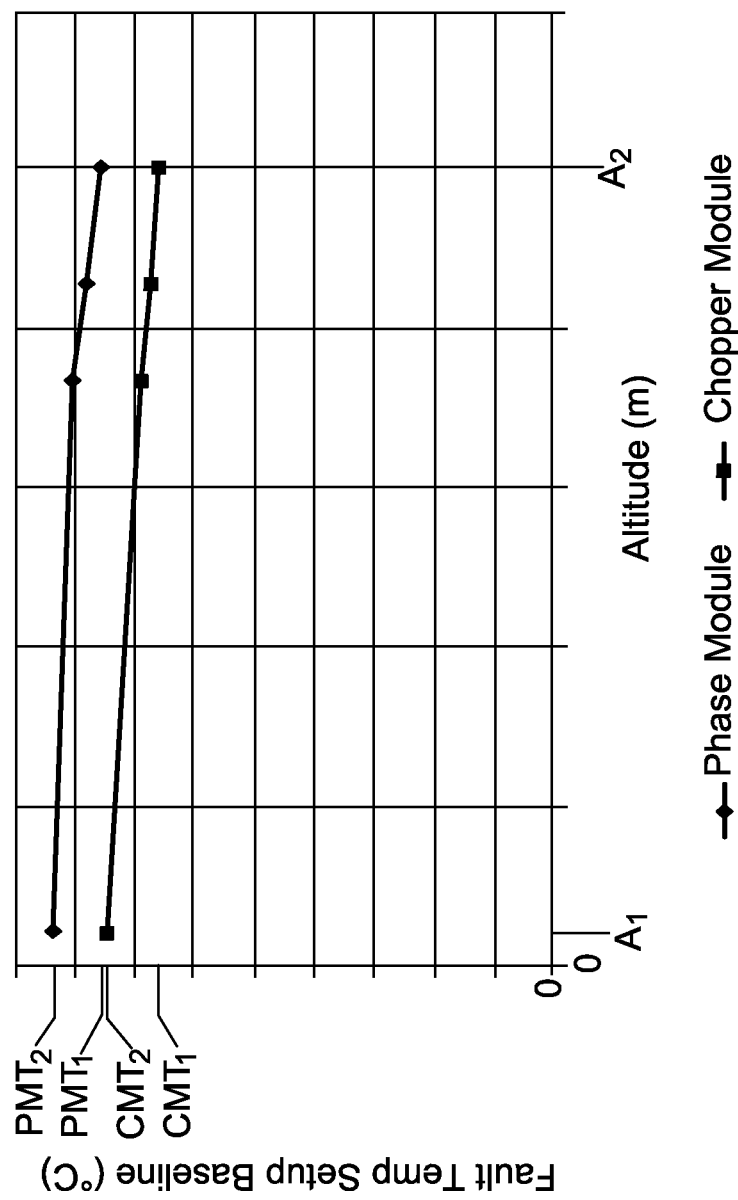
FIG. 2 is a chart of exemplary protection system curves according to the disclosure.

One such representative set of curves for given embodiments having at least one IGBT located as part of a phase module (not specifically illustrated) and/or at least one IGBT located as part of a chopper module (not specifically illustrated) is provided in the diagram FIG. 2. In FIG. 2, two curves provide an indication of the appropriate temperature protection set points for IGBTs located as part of the phase and chopper modules, respectively, for a plurality of altitudes.

It will be appreciated by those of skill in the art that the curves illustrated are provided merely by way of example and will be dependent upon the particulars of a given implementation of the arrangement, including, for example, the physical disposition of the IGBT 16 and the distance between the temperature detector 24 and the IGBT 16. Inasmuch as the altitude is determined based upon the measured pressure, it will be further appreciated that the [X] axis of the diagram of FIG. 2 could alternatively or additionally identify the pressures, rather than the resulting altitude, or that one is indicative of the other. It will further be appreciated that the curve(s) may also be represented by a plurality of associated values for (i) altitude and/or pressure, and (ii) associated temperature set points.

Referring to FIG. 2, for example, when the altitude is A2 meters above sea level based upon the signal from pressure detector 26, then the temperature protection set point will be CMT1° C. for an IGBT located as part of a chopper module, while the temperature protection set point will be CMT2° C. for the same IGBT on a machine operated at an altitude of A1 meters. Similarly, when the altitude is at A2 meters above sea level based upon the signal from pressure detector 26, the temperature protection set point for an IGBT located as part of the phase module will be PMT1° C., while the temperature protection set point will be PMT2° C. for the same machine at an altitude of A1 meters.

Figure 3:
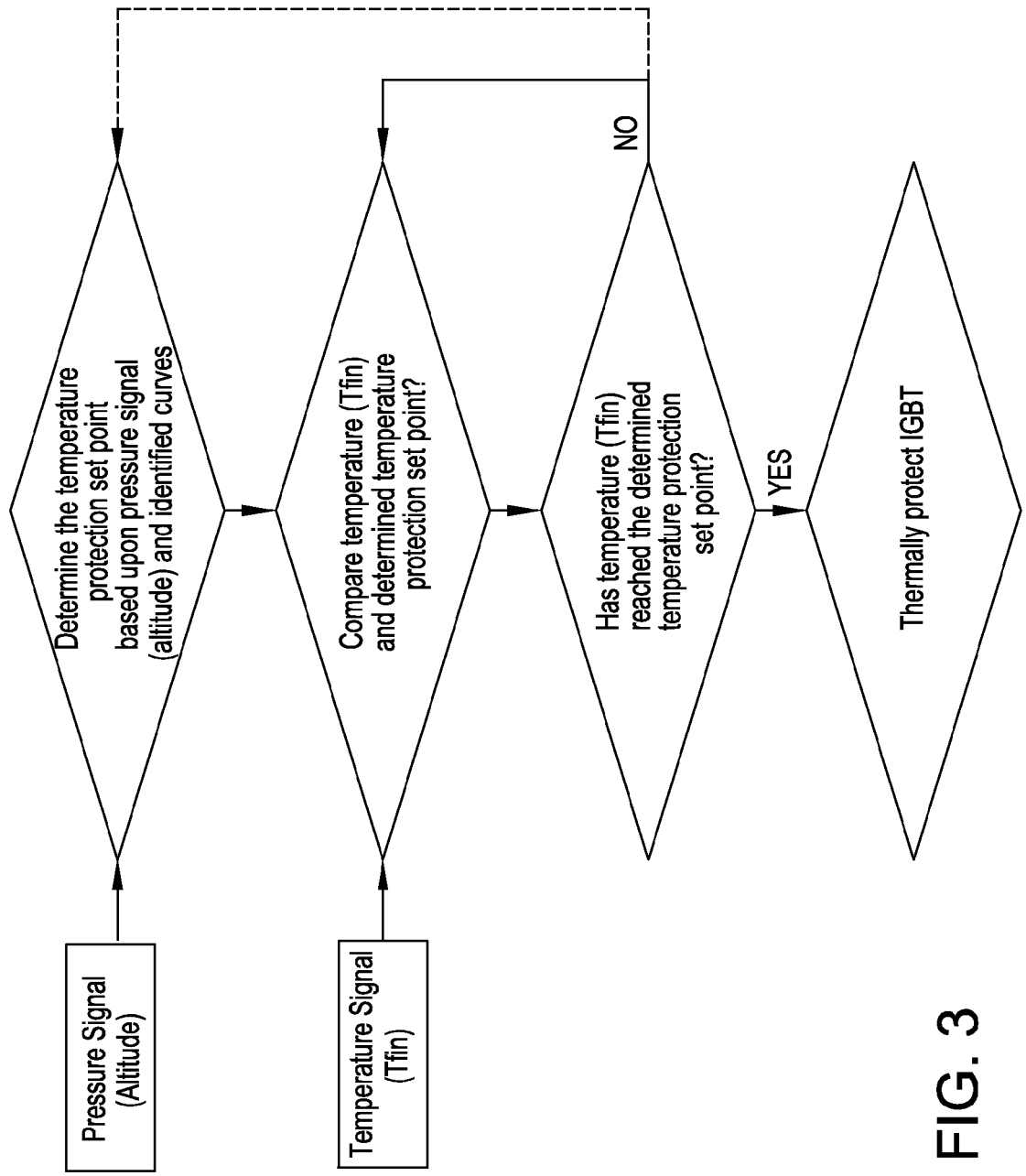
FIG. 3 is a block diagram of a first method according to the disclosure.

Turning to FIG. 3, there is a simplified graphic representation of a method according to the disclosure. As illustrated, signals from the temperature detector 24 and pressure detector 26 are provided to the controller 22. The controller 22 determines the temperature protection set point based upon the pressure signal and a given curve or set of curves, such as those set forth in FIG. 2. The controller then compares the measured temperature (Tfin) represented by the temperature signal to the identified temperature set point.

If the temperature Tfin has not reached the determined temperature protection set point, the method returns to the comparing step. Should the machine 10 be operating at varied altitudes, the method may return to the step of determining the temperature protection set point based upon the pressure signal, i.e., altitude, and identified curves.

Conversely, if the temperature Tfin has reached the determined temperature protection set point, the controller 22 initiates steps to protect the IGBT 16 thermally. Such protection steps may include, for example, engagement of a cooling system 20, and/or passive steps, like providing a warning to the operator, and/or active steps like shutting the machine down.

Figure 4:
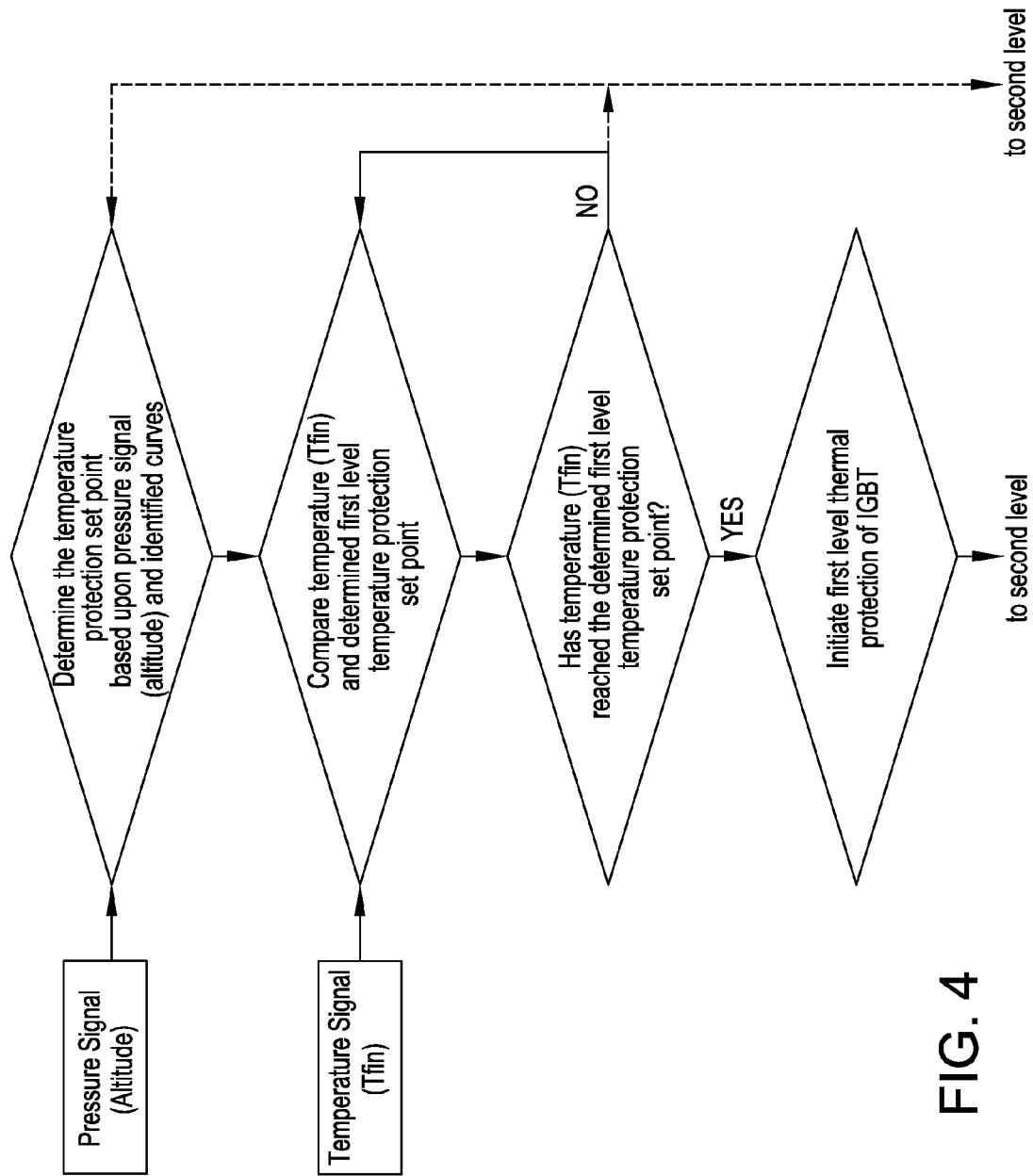
FIGS. 4-6 are block diagrams of a second method according to the disclosure.
Figure 5:
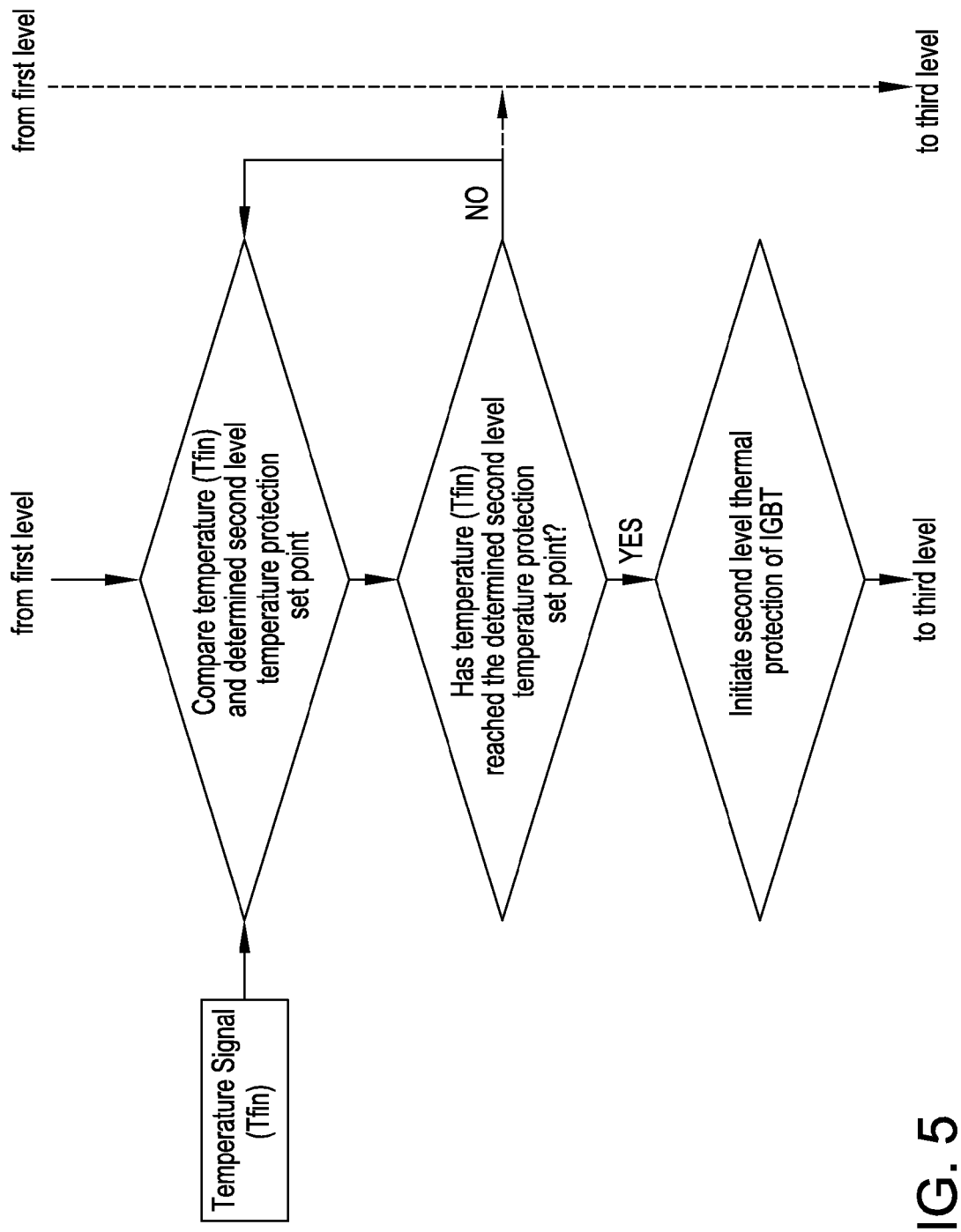
Figure 6:
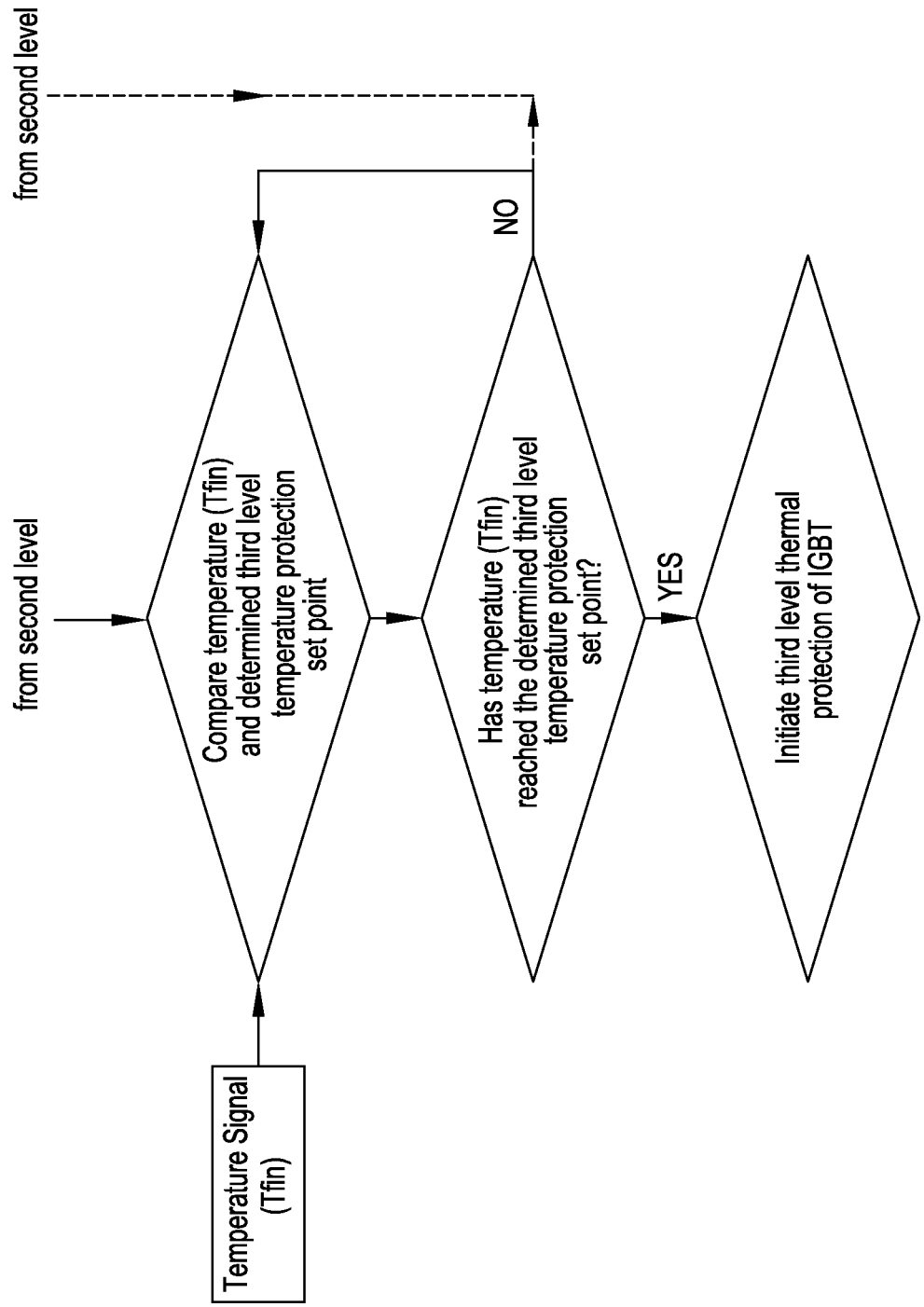

Turning to FIGS. 4-6, there is provided a more detailed graphic representation of a method providing a plurality of levels for thermally protecting the IGBTs. As with the method of FIG. 3, a temperature protection set point is determined based upon the pressure signal, i.e., altitude, and identified curve(s), which may be represented by corresponding values for pressure and/or altitude and temperature protection set point. In the method of FIGS. 4-6, however, a plurality of levels of temperature protection set points are determined. The varied levels may be identified based upon set differences from the temperature protection set point determined based upon the pressure signal, i.e., altitude, and an identified curve. Alternatively, separate curves may be provided for each level.

Turning to FIG. 4, a determined first level temperature protection set point is then compared with the temperature signal corresponding to the measured temperature (Tfin). If the measured temperature (Tfin) has not reached the first level temperature protection set point, then the method returns to the earlier comparison step. Conversely, if the measured temperature (Tfin) has reached the first level temperature protection set point, then first level thermal protection may be initiated. The first level thermal protection may include, for example, the conveyance of information to the operator such as by the illumination of a warning light or other signal.

Turning to FIG. 5, a determined second level temperature protection set point is then compared with the temperature signal corresponding to the measured temperature (Tfin). It will be appreciated that the second level comparison step may alternately be undertaken subsequent to or concurrently with the initiation of the first and/or third level comparison or prior to the initiation of first level thermal protection. If the measured temperature (Tfin) has not reached the second level temperature protection set point, then the method returns to an earlier comparison step. In an alternate embodiment, first level thermal protection of the IGBT may be initiated if the first level temperature protection set point has been reached, but the second level temperature protection set point has not been reached. Conversely, if the measured temperature (Tfin) has reached the second level temperature protection set point, then second level thermal protection may be initiated. The second level thermal protection may include, for example, the conveyance of information to the operator such as by warning of an eminent shut down, activation of an alarm, or engagement of another signal indicating the increased level of concern.

Turning to FIG. 6, a determined third level temperature protection set point is then compared with the temperature signal corresponding to the measured temperature (Tfin). It will be appreciated that the third level comparison step may alternately be undertaken subsequent to or concurrently with the initiation of the first and/or second level comparisons or prior to the initiation of first and/or second level thermal protections. If the measured temperature (Tfin) has not reached the third level temperature protection set point, then the method returns to an earlier comparison step. In an alternate embodiment, second level thermal protection of the IGBT may be initiated if the second level temperature protection set point has been reached, but the third level temperature protection set point has not been reached. Conversely, if the measured temperature (Tfin) has reached the third level temperature protection set point, then third level thermal protection may be initiated. The third level thermal protection may include, for example, more extreme steps such as shutting the machine 10 down.

In an embodiment as illustrated in FIGS. 4-6, as with an embodiment of FIG. 3, should the machine 10 be operating at varied altitudes, the method may include returning to the step of determining the temperature protection set point based upon the pressure signal, i.e., altitude, and identified curves at any time, such as when the measured temperature has not yet reached an identified level temperature protection set point.

The controller 22 may include a processor (not shown) and a memory component (not shown). The processor may be microprocessors or other processors as known in the art. In some embodiments the processor may be made up of multiple processors. The processor may execute instructions for initiation of thermal protection, such as the methods described herein or otherwise. Such instructions may be read into or incorporated into a computer readable medium, such as the memory component or provided external to processor. In alternative embodiments, hard-wired circuitry may be used in place of or in combination with software instructions to implement thermal protection. Thus, embodiments are not limited to any specific combination of hardware circuitry and software.

The term "computer-readable medium" as used herein refers to any medium or combination of media that participates in providing instructions to processor for execution. Such a medium may take many forms, including but not limited to, non-volatile media, volatile media, and transmission media. Non-volatile media includes, for example, optical or magnetic disks. Volatile media includes dynamic memory. Transmission media includes coaxial cables, copper wire and fiber optics, and can also take the form of acoustic or light waves, such as those generated during radio-wave and infrared data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer or processor can read.

The memory component may include any form of computer-readable media as described above. The memory component may include multiple memory components.

The controller 22 may be enclosed in a single housing. In an alternative embodiment, the controller 22 may include a plurality of components operably connected and enclosed in a plurality of housings. The controller 22 may be located on-board an engine 28. In another embodiment, the controller 22 may be located on-board a mobile machine 10. In still other embodiments the controller may be located in a plurality of operably connected locations including on-board an engine, on-board a mobile machine, and remotely.

The controller 22 may be operably coupled to the temperature detector 24 to receive the temperature signal. The controller 22 may be operably coupled to the pressure detector 26 to receive the pressure signal.

INDUSTRIAL APPLICABILITY

The present disclosure is applicable to electric drive machines, particularly such machines for high altitude applications.

The disclosure may be useful in preventing or minimizing opportunities for overheating of electrical transistors, and IGBTs in particular. The disclosure may also be useful in enhancing reliability of thermal protection for such electrical transistors in high altitude applications. As a result, it may minimize down time, and repair and replacement costs.

It will be appreciated that the foregoing description provides examples of the disclosed system and technique. However, it is contemplated that other implementations of the disclosure may differ in detail from the foregoing examples.

All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

I claim:

1. An electronic system for an electric drive mobile machine, the system comprising:
    at least one transistor that emits heat;
    at least one pressure detector disposed to detect pressure and generate a pressure signal;
    at least one temperature detector disposed to detect a first temperature and provide a first temperature signal indicative of the detected first temperature, the first temperature signal further being indicative of a second temperature of or substantially adjacent to the transistor;
    a controller configured to determine a temperature protection set point based upon the first temperature signal and the pressure signal, and to execute a control strategy for thermally protecting the at least one transistor when the first temperature signal indicates that the first temperature has reached the temperature protection set point.

2. The electronic system of claim 1 wherein the controller is configured to determine the temperature protection set point based upon predetermined data associating pressure with temperature along a curve.

3. The electronic system of claim 1 wherein the controller is configured to determine altitude based upon detected pressure, and to determine the temperature protection set point based upon predetermined data associating altitude with temperature.

4. The electronic system of claim 1 wherein the at least one transistor includes an insulated gate bipolar transistor.

5. The electronic system of claim 4 wherein the at least one temperature detector includes a resistance temperature detector.

6. The electronic system of claim 5 wherein the first temperature and the second temperature are substantially the same.

7. The electronic system of claim 5 further comprising a heatsink, the insulated gate bipolar transistor being disposed on the heatsink to provide a junction with the heatsink, the at least one temperature detector being disposed to detect the first temperature at the heatsink, the second temperature being indicative of the temperature at the junction.

8. A method of controlling the application of thermal protections for a heat emitting transistor in an electric drive mobile machine, the method comprising the steps of:
    disposing the transistor in the electric drive mobile machine;
    detecting a pressure substantially indicative of an air pressure surrounding the machine, and generating a pressure signal based upon the detected pressure;
    detecting a first temperature, and providing a first temperature signal indicative of the detected first temperature, the first temperature signal further being indicative of a second temperature of or substantially adjacent to the transistor;
    determining a temperature protection set point based upon the pressure signal and predetermined data associating pressure with temperature along a curve; and
    generating a control strategy for thermally protecting the at least one heat emitting transistor when the first temperature signal indicates that the first temperature has reached the temperature protection set point.

9. The method of claim 8 wherein the determining step includes determining altitude based upon detected pressure.

10. The method of claim 9 wherein the transistor includes at least one insulated gate bipolar transistor, and detecting a first temperature step includes disposing at least one resistance temperature detector to detect the first temperature.

11. The method of claim 8 wherein the step of determining a temperature protection set point includes a step of determining a plurality of levels of temperature protection set points for respective levels of thermal protection, and the generating a control strategy includes generating a control strategy for thermally protecting the at least one heat emitting transistor at escalating levels when the first temperature signal indicates that that the first temperature has reached the respective levels of temperature protection set points.

12. The method of claim 8 wherein the transistor includes at least one insulated gate bipolar transistor, the disposing step includes disposing the insulated gate bipolar transistor on a heatsink, and the method further comprises the steps of disposing at least one pressure detector to detect the pressure indicative of the air pressure surrounding the machine, and disposing at least one resistance temperature detector to detect the first temperature at the heatsink, the second temperature being indicative of the temperature at a junction between the heatsink and the insulated gate bipolar transistor.

13. The method of claim 8 further including the step of executing the control strategy to thermally protect the transistor.

14. A controller for controlling thermal protection of at least one heat emitting transistor in an electric drive mobile machine, the controller including a computer-readable memory having thereon computer-executable instructions including:
    instructions for receiving a pressure signal based upon a detected pressure;
    instructions for receiving a first temperature signal indicative of a detected first temperature, the first temperature signal further being indicative of a second temperature of or substantially adjacent to the heat emitting transistor;
    instructions for determining a temperature protection set point based upon the first temperature signal and the pressure signal; and
    instructions for executing a control strategy for thermally protecting the at least one heat emitting transistor when the first temperature signal indicates that the first temperature has reached the temperature protection set point.

15. The controller according to claim 14 wherein the heat emitting transistor is an insulated gate bipolar transistor.

16. The controller according to claim 14 wherein the temperature signal is provided from a resistance temperature detector.

17. The controller according to claim 14 wherein the instructions for determining a temperature protection set point include instructions for determining a temperature protection set point based upon predetermined data associating pressure with temperature along a curve.

18. The controller according to claim 14 further including instructions for determining altitude based upon the pressure signal, and the instructions for determining the temperature protection set point include instructions for determining a temperature protection set point based upon the first temperature signal and the altitude determined based upon the pressure signal.

19. The controller according to claim 18 wherein the heat emitting transistor is an insulated gate bipolar transistor, and the temperature signal is provided from a resistance temperature detector.

20. The controller according to claim 14 wherein the instructions are executable without operator interface.

* * * * *